United States Patent [19]
Yero

[11] Patent Number: 5,699,295
[45] Date of Patent: Dec. 16, 1997

[54] CURRENT DETECTION CIRCUIT FOR READING A MEMORY IN INTEGRATED CIRCUIT FORM

[75] Inventor: Emilio Yero, Aix-en-Provence, France

[73] Assignee: SGS-Thomson Microelectronics S.A., Saint Genis, France

[21] Appl. No.: 649,282

[22] Filed: May 17, 1996

[30] Foreign Application Priority Data

May 19, 1995 [FR] France .................. 95 06008

[51] Int. Cl.$^6$ .................................................. G11C 7/06
[52] U.S. Cl. .................. 365/185.21; 365/185.2; 365/210
[58] Field of Search ............... 365/185.21, 185.2, 365/205, 208, 210

[56] References Cited

U.S. PATENT DOCUMENTS

| | | | |
|---|---|---|---|
| 5,258,959 | 11/1993 | Dallabora | 365/210 |
| 5,301,149 | 4/1994 | Jinbo | 365/185.21 |
| 5,305,273 | 4/1994 | Jinbo | 365/210 |
| 5,390,147 | 2/1995 | Smarandoiu et al. | 365/185 |
| 5,396,467 | 3/1995 | Liu | 365/210 |
| 5,563,826 | 10/1996 | Pascucci | 365/185.21 |

OTHER PUBLICATIONS

IEEE International Solid State Circuits Conference, vol. 34, Feb. 1991, New York, US, pp. 264–265, Sweha, et al., "A 29ns 8Mb EPROM With Dual Reference–Column ATD Sensing".

Primary Examiner—David C. Nelms
Assistant Examiner—Son Mai
Attorney, Agent, or Firm—Wolf, Greenfield & Sacks, P.C.; James H. Morris

[57] ABSTRACT

In a memory in integrated circuit form, organized as a matrix of rows and columns, a current detection circuit is connected at input to at least one column of the memory and at output to a corresponding read circuit. The current detection circuit includes a transistor connected between the input and the output and controlled at its gate by a reference current detection circuit.

21 Claims, 2 Drawing Sheets

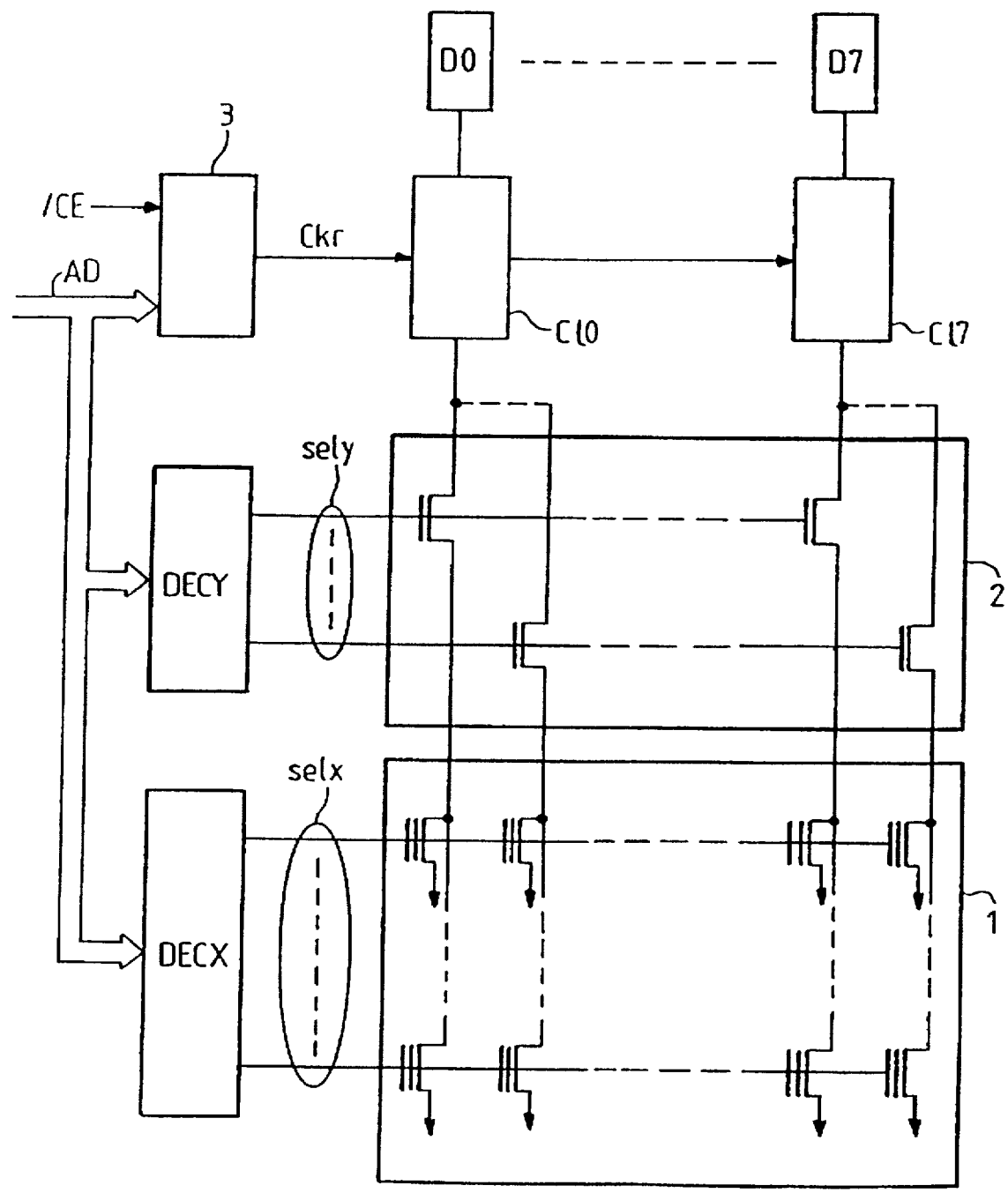
FIG_1

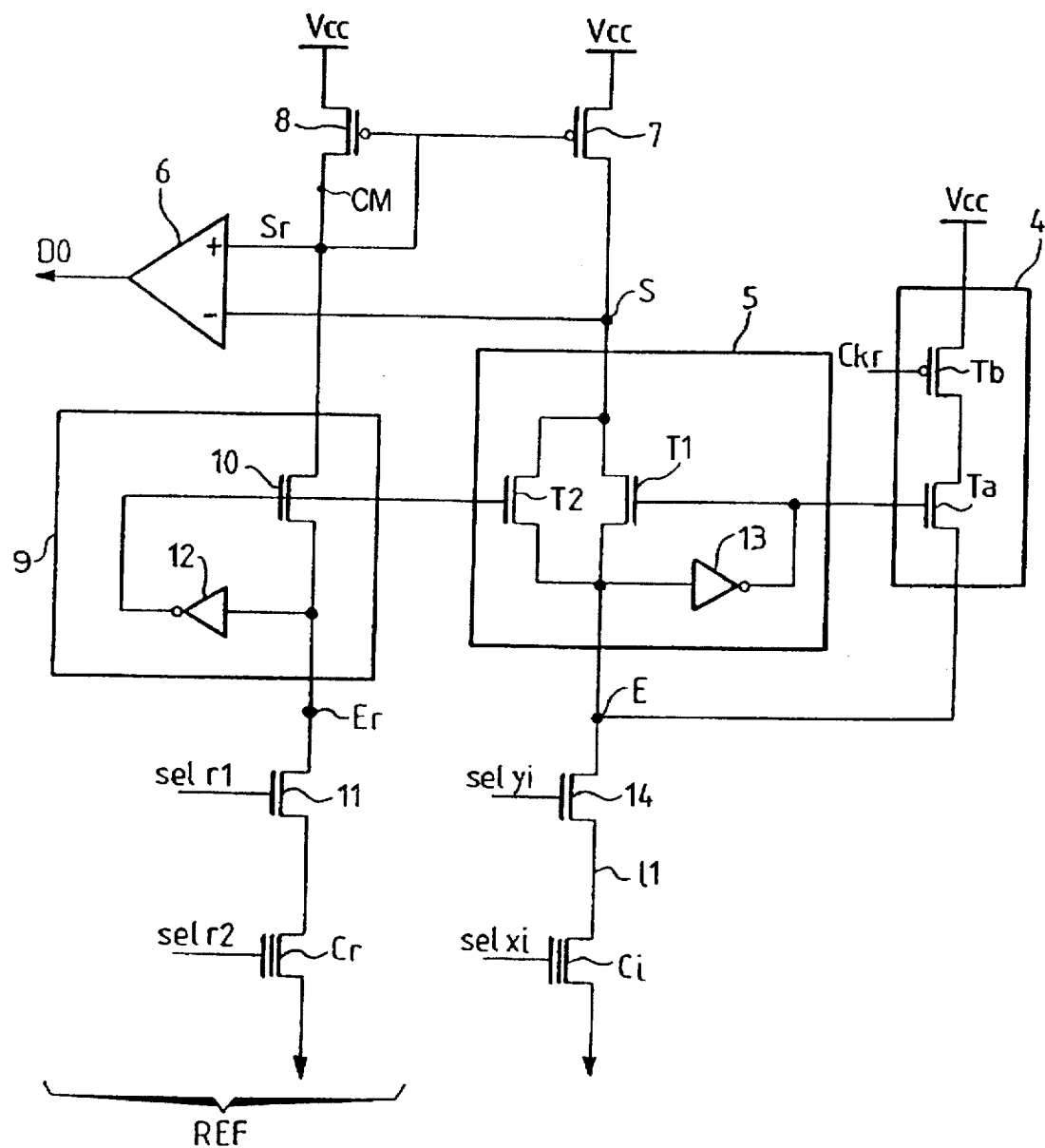

CURRENT DETECTION CIRCUIT FOR READING A MEMORY IN INTEGRATED CIRCUIT FORM

BACKGROUND OF THE INVENTION

1. Field of the Invention

The invention relates to a current detection circuit for reading a memory in integrated circuit form. The invention can be applied especially but not exclusively to electrically programmable memories (such as EPROMs, E2PROMs, and flash EPROMs) whose basic cell is a floating-gate transistor.

2. Discussion of the Related Art

The cells of integrated circuit memories are typically arranged in matrix form. A word line (directly or by means of selection transistors) controls gates of cells located on a row. The state of a cell is read on a bit line connected to the drains of the cells located on a column.

When a memory cell is read, its address is given to a decoder of the memory which selects the corresponding row to apply a read voltage to the gate of the cell and selects the corresponding column to connect it to a reading device.

This reading device conventionally has a current detection circuit having an input connected to the column, and an output that provides an output voltage level varying greatly with the input current. To put it in a simplified way, if the selected cell is conductive to a low extent, then the output voltage level of the current detection circuit will be high. If the cell is highly conductive, then this output voltage level will be low. This output voltage level is applied to a read circuit that provides the binary information. The reading device also has a precharging element (resistor or transistor) that is activated upon the detection of a change in address, to inject current into the current detection circuit. In this way, the (capacitive) bit line is set at a precharging voltage that enables the read access time to be reduced.

The present invention is concerned more particularly with memory type having a read reference cell. In a reference circuit, a reference current detection circuit is associated with a reference cell. The read circuit, in this case, has a differential amplifier that receives the output of the reference current detection circuit at one input and the output of the current detection circuit of a selected column at another input.

One problem related to the differential character of reading is the balancing of the different arms. In particular, a current mirror structure is provided between a current source connected to the output of the reference current detection circuit and the output of the current detection circuit on a column. Furthermore, it may be planned to associate a precharging circuit with the reference circuit to further improve the balancing.

Recent developments in the field of integrated circuit memories relate notably to the use of low external supplies. The memory circuit should then have generation circuits for the internal generation of the logic voltage level needed for operation of the memory. A basic element of these generation circuits is the voltage multiplier.

Since it is furthermore sought to obtain access as speedily as possible to the memories, these internal generation circuits are sized to have high voltage gain.

It has emerged that these circuits for the internal generation of logic voltages could give rise to a greater level of precharging owing to the logic voltage leaks. This greater precharging level gives rise to substantial current in the selected column. This causes an inverter of the associated current detection circuit to flip over. This imposes a cut-off voltage instruction on the transistor of the detector: the output of the current detection circuit goes into high impedance, i.e. the column is temporarily disconnected from the read circuit. Since there is no current at the input of the read circuit, the read circuit interprets the input as zero. This means losing all the advantage of the precharging which consists precisely in prepositioning the read circuit at an intermediate value so that the binary information is obtained as speedily as possible at the output of the read circuit.

SUMMARY OF THE INVENTION

It is an object of the invention to prevent a situation where the connection between the read circuit and the selected column is open.

In an embodiment of the invention, there is provided a device for checking the control instruction for a transistor of the current detection circuit to prevent the transistor from being turned off.

Another problem then appears. This is the problem of maintaining the balance of the read circuit between the reference current detection circuit and corresponding circuit of the selected column.

Another object of the invention is to use the reference current detection circuit to enforce the passage between the input and the output of the current circuit.

According to an embodiment of the invention, a memory in integrated circuit form is organized as a matrix of rows and columns comprising at least one read reference cell associated with a reference current detection circuit. A current detection circuit is connected at input to at least one column of the memory and at output to an input of a comparator. According to an embodiment of the invention, this current detection circuit has a transistor connected between the input and the output and controlled at its gate by the reference current detection circuit.

BRIEF DESCRIPTION OF THE DRAWINGS

The invention will be understood more clearly from the following description, given by way of an indication that does not restrict the scope of the invention, with reference to the appended drawings of which:

FIG. 1 shows an example of the architecture in integrated circuit form, and

FIG. 2 shows a reading device, according to an embodiment of the invention, associated with a column of a memory in integrated circuit form with the read reference circuit.

DETAILED DESCRIPTION

FIG. 1 shows an array of memory cells 1 arranged in matrix form in rows and columns, a gate circuit 2 controlled by a bit row decoder DECY for the selection (sely) of one or more columns (eight in the example), and for the connection of each column to an associated read device C10, . . . , C17.

The memory array is further controlled by a row decoder DECX for the selection (selx) of a row.

An address transition detection circuit 3 that receives selection signals from the memory /CE and from the address bus AD gives an activation signal Ckr for the read devices (C10, . . . , C17) upon the detection of a new address.

A read device associated with at least one column 11 the memory is described in FIG. 2. It comprises a precharging circuit 4, a current detector 5 and a circuit 6.

In the example, the precharging circuit 4 has an N type transistor Ta whose drain is connected to the logic supply voltage Vcc through a switch Tb and whose source is connected to an input E of the current detector 5. The gate of the transistor Ta is controlled by the current detector 5. The switch Tb is controlled by the activation signal Ckr. In the example, the switch Tb is a P type MOS transistor.

The current detector 5 is connected at input E to at least the column 11 by a transistor 14 of the gate circuit 2 of FIG. 1. The input E of the current detector is then actively connected to a column 11 selected by this transistor 14, controlled by a signal selyi of the column decoder DECY (FIG. 1). The other columns, connected if necessary to this same input E, are necessarily deselected.

The read circuit 6 conventionally has a differential amplifier receiving a reference signal Sr at one input, another input being connected to the output S of the current detector 5. The read circuit 6 further includes an output D0 that delivers a binary signal to an input/output pin of the memory in integrated circuit form.

The read device is further associated with a reference circuit REF. This reference circuit REF has a current source 8 and a reference current detector 9 associated with at least one reference cell Cr. It may also include a precharging circuit (not shown).

The current source 8 is conventionally a diode-mounted transistor. In the example, it is a P type MOS transistor having its gate connected to its drain CM, and its source connected to the supply voltage Vcc. This current source 8 is used in a current mirror assembly with the read device. For this purpose, the gate of the transistor 7 is connected to the gate of the transistor 8 of the reference circuit REF. This transistor 7 is connected between the supply voltage Vcc and the output S of the current detection circuit 5. This current mirror structure makes it possible to obtain, in each current detection arm, a current calibrated by the geometrical ratio between these two transistors. This enables efficient balancing of the differential read amplifier.

The reference current detector 9 conventionally has a transistor 10, which for example is an N type MOS transistor. The drain is connected at output Sr of the reference current detector 9 to the drain of the transistor 8, and the source is connected at input Er to a drain of a reference cell Cr, possibly through a switch 11. Furthermore, an inverter 12 is connected between the source and the gate of the transistor 10. A precharging circuit could also be planned, again in order to properly balance the inputs of the differential amplifier. However, in order to simplify the explanation, it is not shown here.

This well known assembly for the detection of current constitutes a servo-link setting up a precharging voltage at the input Er of the reference current detector 9, this precharging voltage being related to the technological characteristics of the transistor 10 and of the inverter 12.

If a cell Ci of the column 11 is selected in read mode (selxi), a corresponding read voltage is applied to its gate (in the range of 5 volts for a flash EPROM cell). The reference circuit REF is selected (i.e., signals selr1 and selr2 are applied respectively to the switch 11 and to the reference cell Cr). The activation signal Ckr is generated. The precharging circuit 4 then gives an injection current to the input of the current detector 5 that servo-links the selected column (11) to a precharging voltage. The cell Ci gives a certain current, as a function of its programmed or non-programmed state, that causes reaction of the current detector 5. A voltage is set up at output S of the current detector 5 and is compared with the voltage reference Sr provided by the reference circuit REF, by the comparator 6 which provides the corresponding binary information element 0 or 1 at its output. This binary information element is transmitted to the pin D0.

According to an embodiment of the invention, the current detector 5 of the read device, which usually has the same structure and the same servo-link characteristics as those of the reference current detector 9 described above, further has a transistor T2 controlled by the reference circuit REF.

In the example, the current detector 5 thus has two transistors T1 and T2 parallel-connected between its input E and its output S.

One of them, T1, is controlled by its gate in a standard way, by the output of an inverter 13.

The other one, T2, is controlled at its gate by the gate of the transistor 10 of the reference current detector 9.

In this way, the output node S of the current detector can no longer be in high impedance for the transistor T2 still enables the passage of current throughout the reading operation, i.e., the passage between the input E and the output S is enforced by the reference circuit REF.

There is no longer any risk of the column being temporarily disconnected from the read circuit and there are therefore no longer any false zero readings.

In practice, the transistors T1 and T2 are sized so that they are equivalent to the transistor 10 of the reference circuit.

The invention can equally well be applied to detectors using several different threshold transistors controlled by the output of the inverter 12 (for the acceleration of the charging of the bit line capacitor). The invention involves separating one of them into two transistors, one of which will be controlled by the reference current detector.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A memory in integrated circuit form, comprising:
   a plurality of memory cells organized as a matrix of rows and columns;
   a comparator having a first input and a second input;
   a reference current detection circuit to deliver a reference signal to the first input of the comparator, the reference current detection circuit being associated with at least one read reference cell; and
   a second current detection circuit having an input connected to at least one column of the matrix, an output connected to the second input of the comparator, and a first transistor connected between the input and the output of the second current detection circuit, the first transistor having a gate controlled by the reference current detection circuit.

2. The memory of claim 1, wherein the second current detection circuit further includes: a first inverter; and at least one second transistor series-connected between the input and the output of the second current detection circuit, and having a gate controlled by the first inverter, wherein the first transistor and the second transistor have a same threshold voltage.

3. The memory of claim 2, wherein the reference current detection circuit includes:

a second inverter; and a reference transistor having a gate controlled by the second inverter, wherein the first transistor has its gate connected to the gate of the reference transistor.

4. A memory reading circuit for reading a memory having a plurality of cells including a memory cell and a reference cell, the memory reading circuit comprising:

a read circuit having a first input, a second input, and an output to provide an output signal indicative of a state of the memory cell;

a first detector having an input coupled to the memory cell, and an output coupled to the first input of the read circuit;

a second detector having an input coupled to the reference cell, a first output coupled to the second input of the read circuit, and a second output to provide a control signal; and an adjustment circuit coupled between the memory cell and the first input of the read circuit, and having an adjustment input coupled to the second output of the second detector.

5. The memory reading circuit of claim 4, wherein the adjustment circuit is a first transistor coupled between the memory cell and the first input of the read circuit, the first transistor having a gate, as the adjustment input, to receive the control signal.

6. The memory reading circuit of claim 5, wherein the first detector includes:

an inverter having an input coupled to the memory cell, and an output; and a second transistor coupled between the memory cell and the first input of the read circuit, the second transistor having a gate coupled to the output of the inverter, the first transistor and the second transistor having substantially equal threshold voltages.

7. The memory reading circuit of claim 5, wherein the second detector includes:

an inverter having an input coupled to the reference cell, and an output, as the second output of the second detector, coupled to the gate of the first transistor of the adjustment circuit; and a second transistor coupled between the reference cell and the second input of the read circuit, the second transistor having a gate coupled to the output of the inverter.

8. The memory reading circuit of claim 7, wherein the first transistor and the second transistor have substantially equal threshold voltages.

9. The memory reading circuit of claim 4, wherein the adjustment circuit is a first transistor coupled between the memory cell and the first input of the read circuit, the first transistor having a gate, as the adjustment input, to receive the control signal;

wherein the first detector includes a first inverter having an input coupled to the memory cell, and an output; and a second transistor coupled between the memory cell and the first input of the read circuit, the second transistor having a gate coupled to the output of the first inverter, the first transistor and the second transistor having substantially equal threshold voltages; and wherein the second detector includes a second inverter having an input coupled to the reference cell, and an output, as the second output of the second detector, coupled to the gate of the first transistor of the adjustment circuit; and a third transistor coupled between the reference cell and the second input of the read circuit, the third transistor having a gate coupled to the output of the second inverter.

10. The memory reading circuit of claim 9, wherein the first transistor and the third transistor have substantially equal threshold voltages.

11. A memory reading circuit for reading a memory having a plurality of cells including a memory cell and a reference cell, the memory reading circuit comprising:

a read circuit having a first input, a second input, and an output to provide an output signal indicative of a state of the memory cell;

a first detector having an input coupled to the memory cell, and an output coupled to the first input of the read circuit;

a second detector having an input coupled to the reference cell, a first output coupled to the second input of the read circuit, and a second output to provide a control signal; and means, responsive to the control signal, for adjusting an electrical condition between the memory cell and the first input of the read circuit.

12. The memory reading circuit of claim 11, wherein the means for adjusting includes means for lowering an impedance between the memory cell and the first input of the read circuit.

13. The memory reading circuit of claim 12, wherein the means for lowering includes means for providing a conducting path between the memory cell and the first input of the read circuit to pass current therebetween.

14. The memory reading circuit of claim 11, wherein means for adjusting is a first transistor coupled between the memory cell and the first input of the read circuit, the first transistor having a gate to receive the control signal.

15. The memory reading circuit of claim 14, wherein the second detector includes:

an inverter having an input coupled to the reference cell, and an output, as the second output of the second detector, coupled to the gate of the first transistor; and a second transistor coupled between the reference cell and the second input of the read circuit, the second transistor having a gate coupled to the output of the inverter.

16. The memory reading circuit of claim 11, wherein the second detector includes:

an inverter having an input coupled to the reference cell, and an output, as the second output of the second detector, coupled to the means for adjusting; and a transistor coupled between the reference cell and the second input of the read circuit, the transistor having a gate coupled to the output of the inverter.

17. A method for reading a memory having a plurality of cells including a memory cell and a reference cell, the method comprising the steps of:

providing a first electrical path between the memory cell and a first input of a read circuit;

providing a second electrical path between the reference cell and a second input of the read circuit;

providing a third electrical path between the memory cell and the first input of the read circuit in response to the step of providing the second electrical path such that, during a read operation, current passes between the memory cell and the first input of the read circuit through the third electrical path; and comparing, by the read circuit, results of the steps of providing to provide an output signal indicating a state of the memory cell.

18. The method of claim 17, wherein the step of providing the third electrical path includes a step of preventing a high impedance condition from existing between the memory cell and the first input of the read circuit.

19. The method of claim 18, wherein the step of preventing includes a step of activating a transistor disposed between the memory cell and the first input of the read circuit to pass current therebetween.

20. The method of claim 17, wherein the step of providing the third electrical path includes a step of activating, in response to a control signal, a first transistor disposed between the memory cell and the first input of the read circuit.

21. The method of claim 20, wherein the step of providing the second electrical path includes a step of activating, in response to the control signal, a second transistor disposed between the reference cell and the second input of the read circuit.

* * * * *